(12) United States Patent
Ju

(10) Patent No.: US 7,226,304 B1
(45) Date of Patent: Jun. 5, 2007

(54) LATCHING DEVICE

(75) Inventor: Ted Ju, Keelung (TW)

(73) Assignee: Lotes Co., Ltd., Keelung (TW)

( * ) Notice: Subject to any disclaimer, the term of this patent is extended or adjusted under 35 U.S.C. 154(b) by 0 days.

(21) Appl. No.: 11/490,043

(22) Filed: Jul. 21, 2006

(51) Int. Cl.
*H01R 13/62* (2006.01)

(52) U.S. Cl. ...................... 439/326; 439/629

(58) Field of Classification Search ........ 439/326–328, 439/629–635
See application file for complete search history.

(56) References Cited

U.S. PATENT DOCUMENTS

| | | | |
|---|---|---|---|
| 3,701,071 A * | 10/1972 | Landman | 200/5 R |
| 5,174,780 A * | 12/1992 | Yang Lee | 439/326 |
| 7,074,090 B2 * | 7/2006 | Ho et al. | 439/630 |
| 7,134,896 B1 * | 11/2006 | Chen | 439/326 |
| 2006/0189196 A1 * | 8/2006 | Kameda | 439/326 |

FOREIGN PATENT DOCUMENTS

CN 1523714 A 8/2004

* cited by examiner

*Primary Examiner*—Hien Vu
(74) *Attorney, Agent, or Firm*—Rosenberg, Klein & Lee

(57) ABSTRACT

The present invention of a latching device includes a positioning portion and at least one retaining element. The positioning portion has at least one positioning post and at least one receiving groove. The receiving groove passes through the positioning portion and the positioning post. The retaining element is received in the receiving groove. The retaining element has at least one clamping portion. Because the clamping portion of the latching device passes through the hole of the card and buckles the card, the latching device can be disposed on the bottom of the card. Thereby, the object of the embodiment is achieved.

4 Claims, 4 Drawing Sheets

US 7,226,304 B1

LATCHING DEVICE

BACKGROUND OF THE INVENTION

1. Field of the Invention

The present invention relates to a latching device, and in particular to a latching device having a clamping portion for buckling a card.

2. Description of Related Art

An interface card is used to connect a circuit board of a computer to a peripheral device. Since portable electronic devices are becoming continually thinner, interface cards are becoming smaller, too.

Until recently, for example, Mini PCI interface cards commonly used for notebook computers were designed to be inserted crossways. After the interface card was inserted in to the connector, the interface card was parallel with the main board for reducing the height of the used space.

Besides improving the structure of the connector, the main board provides a latching device that supports the interface card. The latching device prevents the interface card from detaching from the connector due to external forces or shaking. However, the latching device, such as China patent No. 200410001481.4, is very complex, difficult to produce, and expensive. The space required for the latching device is large because the latching device is disposed on the side of the interface card.

Thus, a new designed latching device is needed to overcome the defects above.

SUMMARY OF THE INVENTION

It is an object of the present invention to provide a latching device. Because the clamping portion of the latching device passes through the hole of the card and then buckles the card, the latching device can be disposed on the bottom of the card. Thereby, the object of the embodiment can be achieved.

To achieve the above object, a latching device includes a positioning portion having at least one positioning post and at least one receiving groove. The receiving groove passes through the positioning portion and the positioning post. At least one retaining element is received in the receiving groove, and the retaining has at least one clamping portion.

BRIEF DESCRIPTION OF THE DRAWINGS

The present invention can be fully understood from the following detailed description and preferred embodiments with reference to the accompanying drawings, in which.

DETAILED DESCRIPTION OF THE PREFERRED EMBODIMENTS

The following detailed description is of the best presently contemplated modes of applying the invention. This description is not intended to be taken in a limiting sense, but is made merely for the purpose of illustrating general principles of embodiments of the invention. The scope of the invention is best defined by the appended claims.

Figure 1:
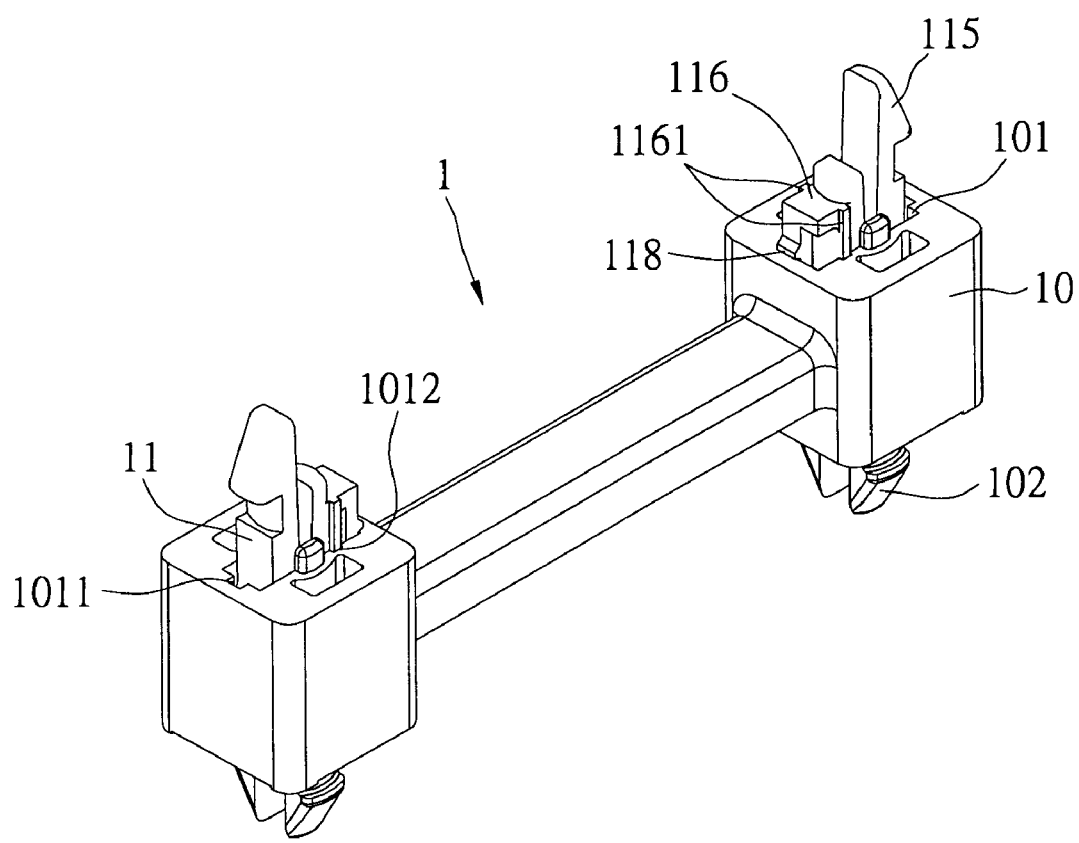
FIG. 1 is a perspective view of a latching device according to the present invention.
Figure 2:
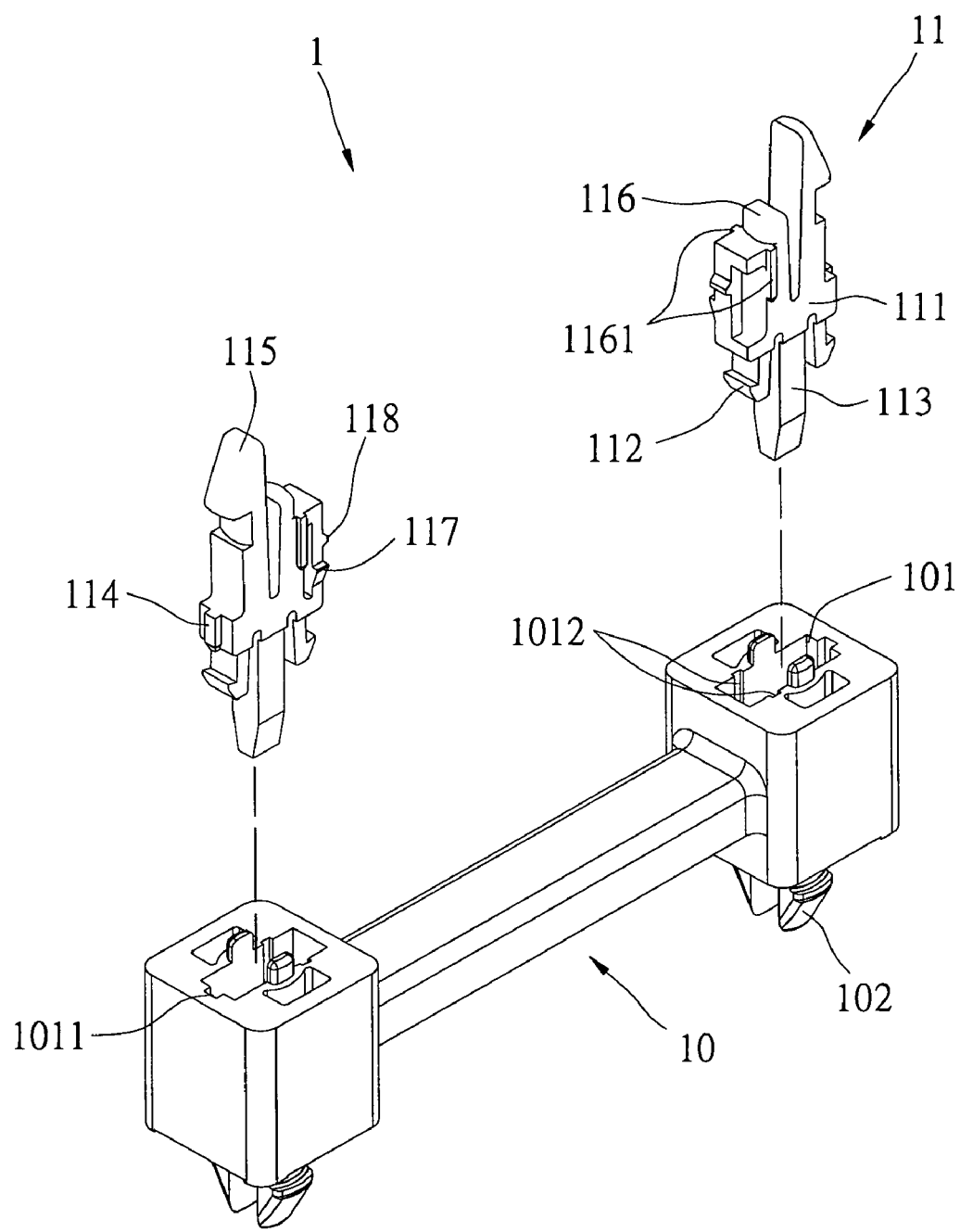
FIG. 2 is an exploded view of a latching device according to the present invention.
Figure 3:
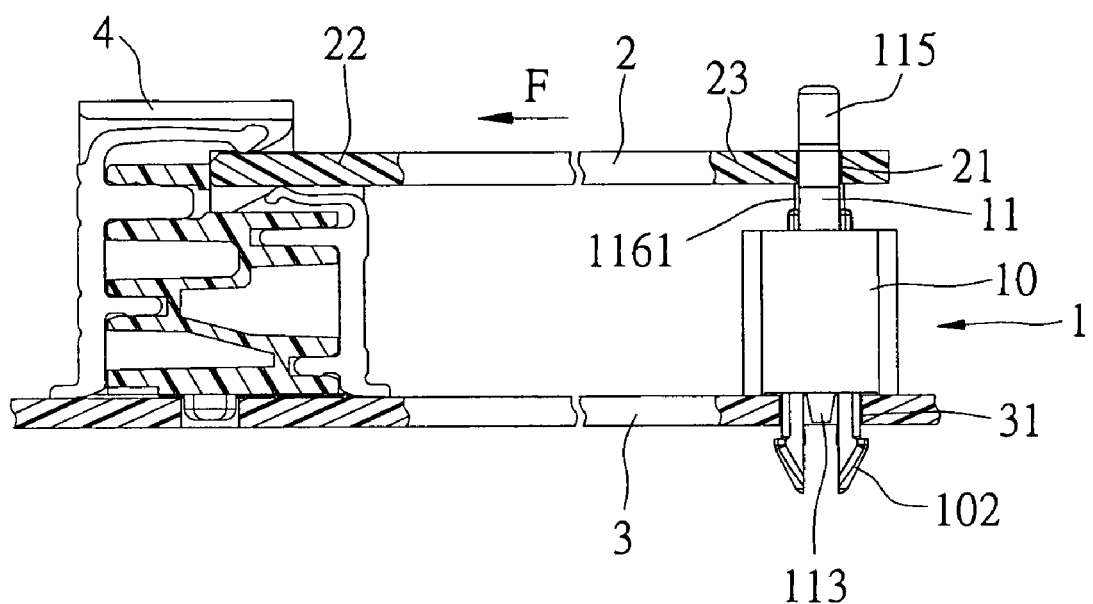
FIG. 3 is a perspective view of a latching device, an interface card, a connector, and a circuit board according to the present invention.

Reference is made to FIGS. 1, 2 and 3. A latching device 1 of the present invention is fixed on a circuit board 3. The latching portion is used to latch an interface card 2, or other coupling elements (such as a circuit board) with an engaging connector 4. A first end 22 of the interface card 2 is connected with the engaging connector 4. The latching device 1 latches a second end 23 of the interface card 2 that is opposite to the first end 22.

The latching device 1 includes a positioning portion 10 and two retaining elements 11. Two receiving grooves 101 are disposed on the positioning portion 10 respectively. The retaining elements 11 are received in the receiving grooves 101 respectively.

A harpoon-like positioning post 102 is disposed on the bottom of the positioning portion 10. The positioning post 102 penetrates vertically from the top surface to the bottom surface of the positioning portion 10. The positioning post 102 is fixed in a hole 31 of the circuit board 3 for fixing the latching device 1 on the circuit board 3.

The retaining element 11 includes a body 111. A harpoon-like retaining portion 112 is disposed on the bottom of the body 111. A tab-like fixing post 113 is disposed on a middle of the retaining portion 112. The fixing post 113 prevents the positioning post 102 from detaching from the hole 31 of the circuit board 3. The retaining portion 112 is fixed on a fixing portion (not shown in the figures) corresponding to the receiving groove 101. A first guiding track 114 is disposed on a side of the body 111. The body 111 forms a clamping portion 115 and a matching portion 116. A second guiding track 1161 is disposed on the two opposite sides of the matching portion 116 respectively. The receiving groove 101 has a first guiding channel 1011 that corresponding to the first guiding track 114 and a second guiding channel 1012 that is corresponds to the second guiding track 1161 for guiding the retaining element 11 in to the receiving groove 101. The other side of the matching portion 116 forms a first hook 117 and a second hook 118 that are connected with the body 111. The first hook 117 is retained with a first protrusion (not shown in the figures) of the receiving groove 101. The second hook 118 is attached to the top surface of the positioning portion 10.

When installing the interface card 2, the first end 22 of the interface card 2 is firstly inserted into the engaging connector 4. Next, the hole 21 of the interface card 2 is matched with a corresponding clamping portion 115 of the retaining element 11. Finally, the second end 23 of the interface card 2 is pressed, and then the clamping portion 115 is moved inwardly. When the hole 21 of the interface card 2 passes through the clamping portion 115, the clamping portion 115 rebounds outwardly. To remove the interface card 2, the clamping portion 115 is pushed inward, and then the interface card 2 will spring upward. Because the clamping portion 115 passes through the hole 21 of the interface card 2, the latching device 1 can be disposed on the bottom of the interface card 2. Thereby, the amount of space used is reduced because the latching device 1 is not disposed on the side end of the interface card 2.

Figure 4:
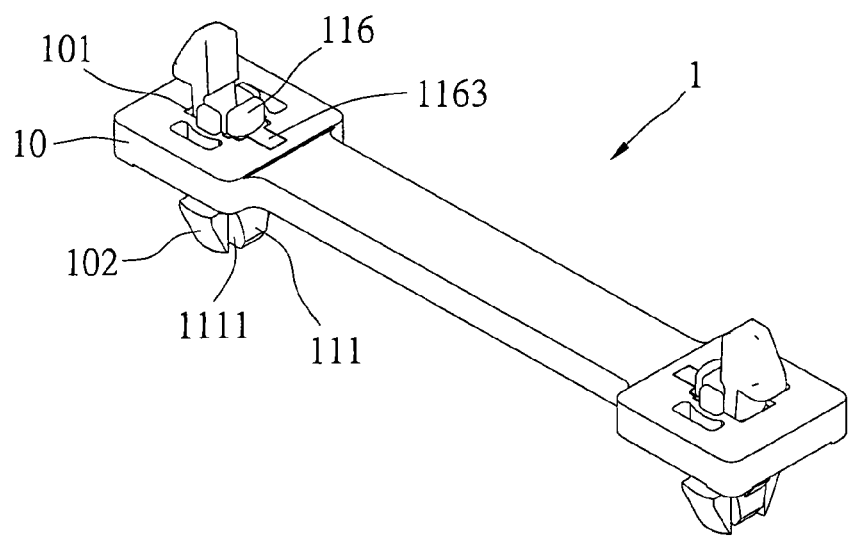
FIG. 4 is a perspective view of a latching device according to the second embodiment of the present invention.
Figure 5:
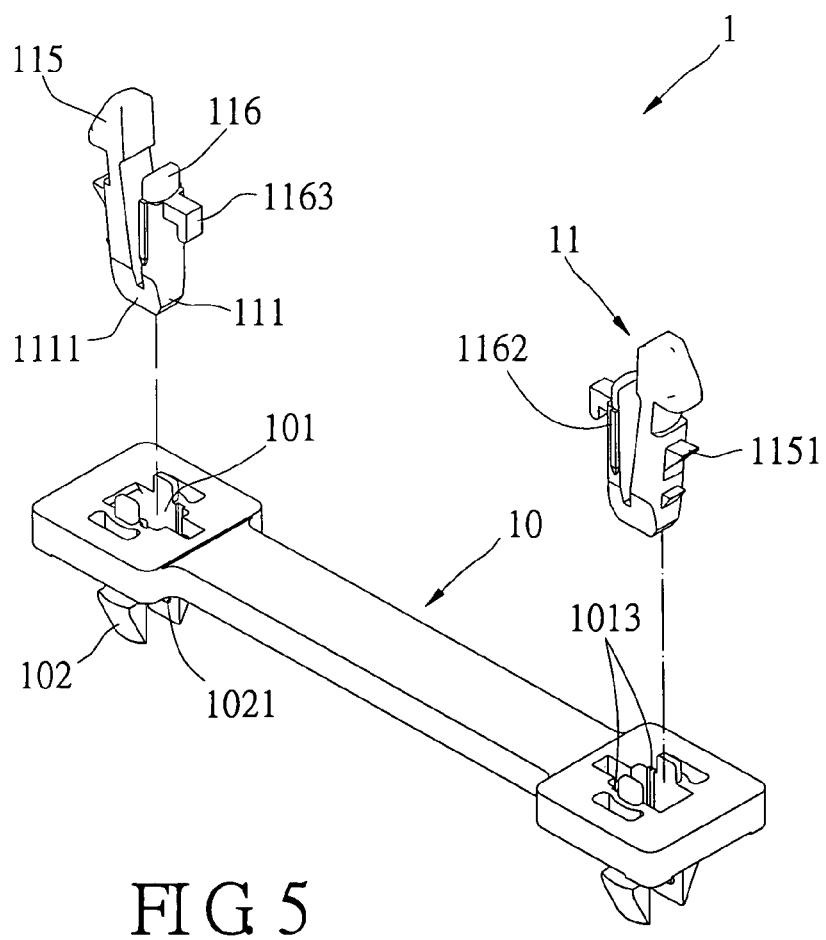
FIG. 5 is an exploded view of a latching device according to the second embodiment of the present invention.

Referring to FIGS. 4 and 5, the second embodiment of the present invention is shown. The difference between the first embodiment is that both sides of body 111 are formed in an incline 1111. Both of the inner sides of the positioning post 102 have a lug 1021. The body 1111 is received in the receiving groove 101. Because the incline 1111 is attached to the lug 1021, the positioning post 102 is difficult to detach from the hole 31 of the circuit board 3. Both the outer opposite sides of the matching portion 116 have guiding tracks 1162. The receiving groove 101 has a guiding channel 1013 corresponding to the guiding track 1162 for guiding the retaining element 11 in to the receiving groove 101. The other side of the matching portion 116 is extended curvedly to form an L-shaped fixing hook 1163. The fixing hook 1163 is buckled with the stopping portion (not shown in the figures) of the receiving groove 101. One side of the clamping portion 115 has a hook 1151. The hook 1151 is buckled with the protrusion (not shown in the figures) in the receiving groove 101. The latching device 1 is buckled in the hole 21 of the interface card 2 by the clamping portion 115. The latching device 1 can be disposed on the bottom of the interface card 2. Thereby, the object of the embodiment is achieved.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. A latching device, comprising:
   a positioning portion having at least one positioning post and at least one receiving groove, the receiving groove passes through the positioning portion and the positioning post; and
   at least one retaining element received in the receiving groove, the retaining element having at least one clamping portion and at least one hook, the receiving groove having at least one protrusion, and the hook buckles the protrusion, the retaining element having a body, the body having retaining portions, a fixing post being positioned in a middle between the retaining portions, and the retaining portions and the fixing post being received in the receiving groove.

2. The latching device as claimed in claim 1, wherein the retaining element has at least one guiding track, the receiving groove has at least one guiding channel, and the guiding channel corresponds to the guiding track.

3. The latching device as claimed in claim 1, wherein the positioning post is fixed on the circuit board.

4. The latching device as claimed in claim 1, wherein the latching device is used with a connector that is installed on a board, a first end of a card is connected with the connector, and a second end of the card is connected with the clamping portion of the latching device.

* * * * *